(12) United States Patent
Merino

(10) Patent No.: US 7,727,059 B2
(45) Date of Patent: Jun. 1, 2010

(54) METHOD AND APPARATUS FOR ACOUSTIC NOISE REDUCTION IN A COMPUTER SYSTEM HAVING A VENTED DOOR INCLUDING A PIVOTABLE VENTED BASE AND A PIVOTABLE OUTER DOOR

(75) Inventor: Tristan Alfonso Merino, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 765 days.

(21) Appl. No.: 11/557,546

(22) Filed: Nov. 8, 2006

(65) Prior Publication Data

US 2008/0106864 A1 May 8, 2008

(51) Int. Cl.
*H05K 5/00* (2006.01)
*H05K 7/20* (2006.01)

(52) U.S. Cl. ...................................... 454/184; 361/695
(58) Field of Classification Search ................. 454/184; 361/695

See application file for complete search history.

(56) References Cited

U.S. PATENT DOCUMENTS 7,169,038 B1 * 1/2007 Vignau ....................... 454/195
7,400,501 B2 * 7/2008 Bartell et al. ............... 361/695

* cited by examiner

*Primary Examiner*—Steve McAllister
*Assistant Examiner*—Helena Kosanovic
(74) *Attorney, Agent, or Firm*—Matthew J. Bussan; James R. Nock

(57) ABSTRACT

A vented door for a computer system includes a vented base and an outer door. The vented base and the outer door are separately pivotable. The vented base is pivotably attached to the computer system's enclosure for movement between a closed configuration where the vented base abuts against a panel of the enclosure and an open configuration where the vented base is swung away from the panel. The outer door is pivotably attached to the vented base to avoid interfering with a neighboring computer system's vented door as the vented base is pivoted to the open configuration. An acoustic noise reduction lining is provided on the outer door and in the air flow apertures of the vented base. The outer door is preferably removable from the vented base so that the combined weight of the vented base and the outer door need not be lifted when removal is necessary.

6 Claims, 14 Drawing Sheets

METHOD AND APPARATUS FOR ACOUSTIC NOISE REDUCTION IN A COMPUTER SYSTEM HAVING A VENTED DOOR INCLUDING A PIVOTABLE VENTED BASE AND A PIVOTABLE OUTER DOOR

BACKGROUND OF THE INVENTION

1. Field of Invention

The present invention relates in general to housings for enclosing computer systems and in particular to vented doors with acoustic attenuation for use with such housings. More particularly, the present invention relates to a computer system which includes a vented door having a pivotable vented base and an outer door that is pivotable relative to the base.

2. Background Art

Computer systems are using larger amounts of energy, and are generating more heat. Increased heat generation is driven by factors such as increases in processor performance and clock speed, and increases in the number of devices per integrated circuit. Electronic components, such as microprocessors and integrated circuits, must operate within certain specific temperature ranges to perform efficiently. Excessive heat degrades electronic component performance, reliability, life expectancy, and can even cause failure. Air moving devices (AMDs), such as fans and blowers, are widely used for controlling excessive heat. AMDs are often used in combination with heat sinks thermally connected to electronic components to be cooled. Typically, heat sinks are formed with fins to increase the surface area of the heat sink and thereby enhance heat dissipation as air moved by an AMD passes over the heat sink.

In many large server applications, the processors of a computer system along with their associated electronics (e.g., memory, disk drives, power supplies, etc.) are packaged in removable drawer configurations stacked within a rack or frame. In other cases, the processors of a computer system along with their associated electronics may be in fixed locations within the rack or frame. Typically, the components are cooled by air moving in parallel air flow paths, usually front-to-back, impelled by one or more AMDs.

With the advent of the increased heat generated by computer systems, increased ventilation is required to move cooling air through the computer system. A failure to provide adequate ventilation through a computer system may increase the probability of computer failure due to overheating and may result in damage to the electronic components. Due to the great expense of these electronic components and the concomitant loss of processing time associated with such failures, it is desirable that adequate ventilation be maintained for computer systems. Increased air flow rates are needed to provide adequate ventilation. However, the acoustic noise associated with the increased air flow rates required to provide adequate ventilation, as well as acoustic noise generated by the various components within the computer system, represents a problem that must be overcome. There are limits on the acoustic output of computer systems (e.g., servers and storage products) set by vendors, governments, standards setting bodies, and the like.

In order to reduce acoustic noise, it is known to utilize an acoustic noise reduction lining in vented covers of computer systems. An example of such an arrangement is found in U.S. Pat. No. 5,526,228, issued Jun. 11, 1996 to Dickson et al., entitled "COMPUTER SYSTEM UNIT WITH ACOUSTIC DAMPENING COOLING FAN SHROUD PANEL", which is assigned to the assignee of the present application. As shown in FIG. 1, a cooling fan shroud panel 16 includes an acoustic noise reduction lining comprising a side acoustic foam panel 28 and a top acoustic foam panel 30. The acoustic dampening cooling fan shroud panel 16 is mounted to an intermediate rear panel 32 of a computer system unit 10. Two cooling fans 34, 36 are mounted within fan mounting apertures 35, 37 of the intermediate rear panel 32. The cooling fans 34, 36 draw air through computer system unit 10 from an intake ventilation grill (not shown) of a front panel 12 in the direction indicated by the arrows designated with reference numeral 44. Mounted within computer system unit 10 are a power supply 38 and an electronic component package 40, which are cooled by the air drawn through computer system unit 10. Air is directed out an exiting ventilation aperture 22 of cooling fan shroud panel 16 in the direction indicated by the arrow designated with reference numeral 42. The exiting ventilation aperture 22 is displaced from the mounting position of the cooling fans 34, 36 such that acoustic noise resultant from the cooling fan operation is diminished. Even though acoustic dampening cooling fan shroud panel 16 is effective in diminishing acoustic noise, it exhibits a number of disadvantages. First, the relatively substantial depth of acoustic dampening cooling fan shroud panel 16 significantly increases the footprint of computer system unit 10. Second, the small area of exiting ventilation aperture 22 relative to intermediate rear panel 32 reduces the cooling efficiency.

FIG. 2 shows another example of the utilization of acoustic noise reduction lining in vented covers found in the IBM eServer zSeries 900 server. As shown in FIG. 2 (Top View), an inlet cover 210 includes an acoustic noise reduction lining comprising two outer acoustic foam panels 212 and central acoustic foam block 214. Inlet ventilation apertures 216 are defined between outer acoustic foam panels 212 and central acoustic foam block 214. Inlet cover 210 also includes intake extensions 213 and 215 that respectively project from one of the two outer acoustic foam panels 212 and central acoustic foam block 214. In addition, inlet cover 210 includes four curved vanes 217. Intake extensions 213, 215 and curved vanes 217 are configured and positioned to suitably direct and distribute the incoming air through inlet ventilation apertures 216 and toward the various heat generating components housed within a computer system frame or rack 200. Similarly, an exhaust cover 220 includes an acoustic noise reduction lining comprising two outer acoustic foam panels 222 and central acoustic foam block 224. Exhaust ventilation apertures 226 are defined between outer acoustic foam panels 222 and central acoustic foam block 224.

The inlet cover 210 and the exhaust cover 220 are mounted to computer system frame or rack 200 using hinges (not shown) so that removable drawers (not shown) stacked within computer system frame 200 may be accessed when inlet cover 210 and/or exhaust cover 220 is/are swung open via the hinges. AMDs (not shown) draw air through computer system frame 200 from inlet ventilation apertures 216 and exhaust the air through exhaust ventilation apertures 226. The air moves in the direction indicated by arrows designated by reference numeral 230. The removable drawers, which contain processors and their associated electronics, are cooled by the air drawn through computer system frame 200, as are electronic components fixed within computer system frame 200. Acoustic noise resultant from the AMD operation is effectively diminished by inlet cover 210 and exhaust cover 220 which have three main attributes: a large amount of acoustic absorbing material; an air/noise path that curves or angles to force sound to impact the acoustic lining; and minimum sharp bends in the air path to minimize airflow resistance.

Even though inlet cover 210 and exhaust cover 220 are effective in diminishing acoustic noise, they exhibit a number of disadvantages. First, the relatively substantial depth of inlet cover 210 and exhaust cover 220 significantly increase the footprint of computer system frame 200. For example, to accommodate a sufficient amount of acoustic foam and air inlet openings of sufficient size, the depth of inlet cover 210 (denoted as dimension "D" in FIG. 2) often exceeds 12 inches.

Second, the weight of inlet cover 210 and exhaust cover 220 can be excessive. For example, the weight of inlet cover 210 often approaches or exceeds the maximum weight one person is permitted to lift (e.g., 39.7 pounds). This situation is disadvantageous because it requires two customer engineers (CEs) to be sent on service calls.

Third, inlet cover 210 and exhaust cover 220 are dimensionally confined to an area within a physical envelope necessary to allow adjacent covers to hinge open against each other. The inlet cover 210 and exhaust cover 220 are typically chamfered 45° on each side as shown in FIG. 2 to allow adjacent cover doors to hinge open 90° against each other. Accordingly, the dimensions of inlet cover 210 and exhaust cover 220 are each limited to an area within a physical envelope (denoted in FIG. 2 as two dashed lines labeled as 240 with respect to inlet cover 210) that does not interfere with swinging one cover open 90° against an adjacent cover.

FIG. 3 shows an inlet cover 210 swung open 90° via one or more hinges (not shown) against an adjacent inlet cover 210, which is closed against its computer system frame 200. As mentioned above, each inlet cover may be swung open 90° to access components within its computer system frame, such a removable drawers.

It should therefore be apparent that a need exists for a computer system enclosure which can both adequately ventilate a computer system housed therein and reduce the amount of acoustic noise, while addressing the disadvantages of the prior art.

SUMMARY OF THE INVENTION

According to the preferred embodiment of the present invention, a vented door for a computer system includes a vented base and an outer door. The vented base and the outer door are separately pivotable. The vented base is pivotably attached to the computer system's enclosure for movement between a closed configuration where the vented base abuts against a panel of the enclosure and an open configuration where the vented base is swung away from the panel. The outer door is pivotably attached to the vented base to avoid interfering with a neighboring computer system's vented door as the vented base is pivoted to the open configuration. An acoustic noise reduction lining is provided on the outer door and in the air flow apertures of the vented base. The outer door is preferably removable from the vented base so that the combined weight of the vented base and the outer door need not be lifted when removal is necessary.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1.0 Overview

In accordance with the preferred embodiments of the present invention, a vented door for a computer system includes a vented base and an outer door. The vented base and the outer door are separately pivotable. The vented base is pivotably attached to the computer system's enclosure for movement between a closed configuration where the vented base abuts against a panel of the enclosure and an open configuration where the vented base is swung away from the panel. The outer door is pivotably attached to the vented base to avoid interfering with a neighboring computer system's vented door as the vented base is pivoted to the open configuration. An acoustic noise reduction lining is provided on the outer door and in the air flow apertures of the vented base. The outer door is preferably removable from the vented base so that the combined weight of the vented base and the outer door need not be lifted when removal is necessary.

2.0 Detailed Description

Figure 4:
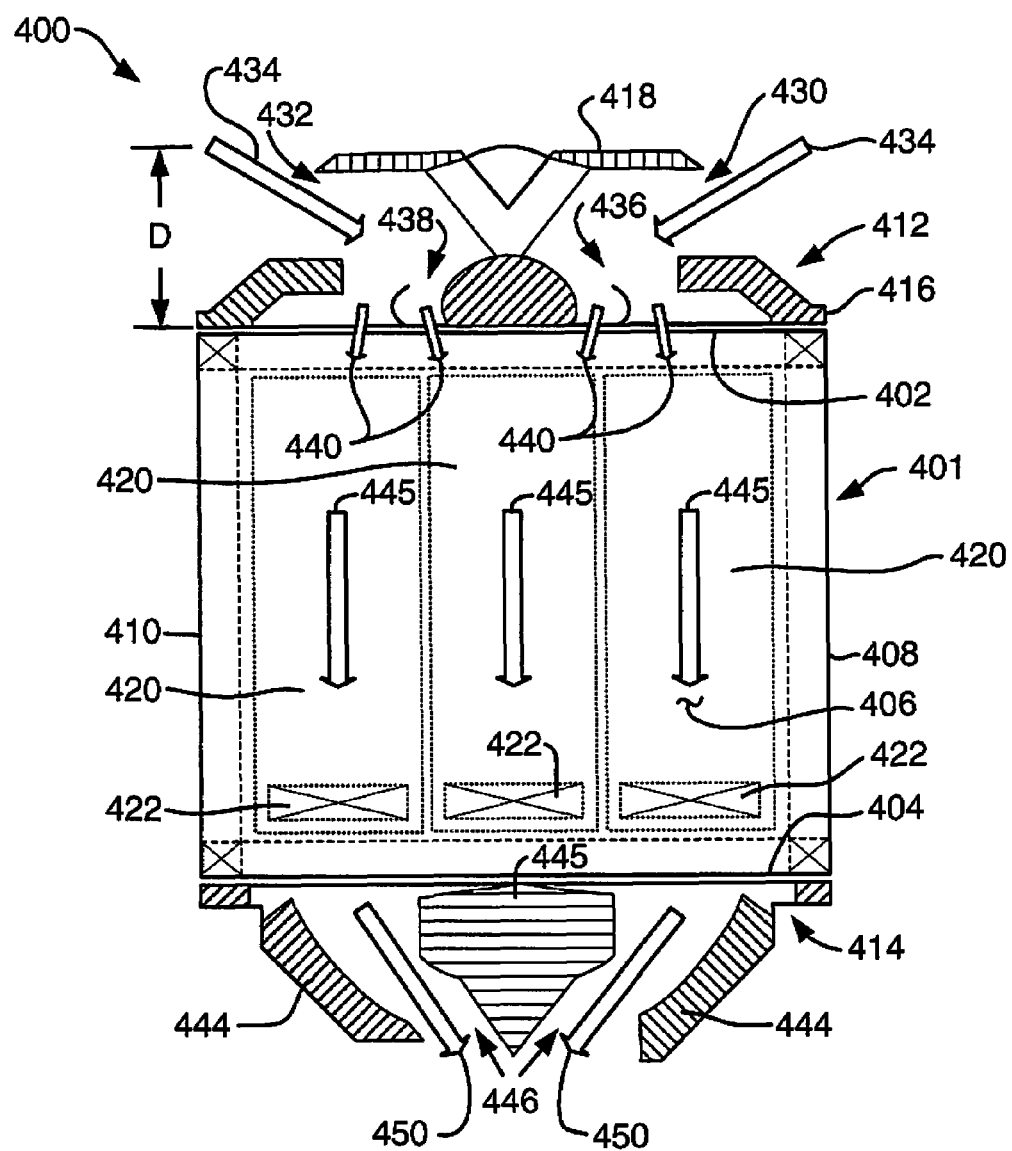
FIG. 4 is a partially sectional, top view of a computer system incorporating a vented intake door having a vented base and a outer door according to the preferred embodiments of the present invention.

With reference to the figures and in particular FIG. 4, there is depicted a top view of a computer system 400 having a computer system enclosure 401 (also referred to as a computer system frame or rack) which incorporates one or more vented doors with acoustic noise reduction according to the preferred embodiments of the present invention. Although the preferred embodiments of the present invention are described herein within the context of an enclosure for containing a computer system, those skilled in the art will appreciate that the present invention may be practiced with an enclosure for containing any type of system. For example, the present invention may be practiced with an enclosure for an air treatment system, such as an air filter, air cleaner, dehumidifier, air conditioner, heater, or the like. Likewise, the present invention may be practiced with an enclosure for containing a computer system different than that shown in FIG. 4. For example, the present invention can be applied to enclosures containing computer systems, including personal computers, servers and data storage systems, of various sizes such as small towers (e.g., desktop computer systems), individual rack units and large rack frames (e.g., receiving multiple server units).

As illustrated in FIG. 4, computer system enclosure 401 preferably includes a front panel 402, a rear panel 404, a top panel 406, a bottom panel (not shown), and two side panels 408, 410. However, those skilled in the art will appreciate that computer system enclosure 401 may have any number and configuration of panels. One or more vented doors 412, 414 are also provided according to the preferred embodiments of the present invention. As illustrated, vented door 412 is mounted at the front of computer system enclosure 401, while vented door 414 is mounted at the rear of computer system enclosure 401. As illustrated in FIG. 4, vented door 414 is conventional and generally corresponds to exhaust cover 320 discussed above in the Background Art section with reference to FIG. 3. Vented cover 414 is pivotably attached to computer system enclosure 401 and in a closed configuration shown in FIG. 4 abuts against rear panel 404, which has one or more airflow passages (not shown) therein. In an open configuration (shown in FIG. 5), vented door 414 is swung away from the rear panel 404. Preferably, vented door 414 pivots through an angle of approximately 90° from the closed configuration to the open configuration using one or more conventional hinges (not shown) attached to both vented door 414 and computer system enclosure 401.

The vented door 412 lies at the heart of the present invention and includes a vented base 416 and an outer door 418. Vented base 416 is pivotably attached to computer system enclosure 401 and in a closed configuration shown in FIG. 4 abuts against front panel 402, which has one or more airflow passages (not shown) therein. In an open configuration (shown in FIG. 5), vented base 416 is swung away from the front panel 402. Preferably, vented base 416 pivots through an angle of approximately 90° from the closed configuration to the open configuration using one or more conventional hinges (not shown) attached to both vented base 416 and computer system enclosure 401. Vented base 416 is preferably chamfered 45° on each side as shown in FIG. 4 to allow vented door 412 and adjacent vented doors to hinge open 90° against each other.

Figure 5:
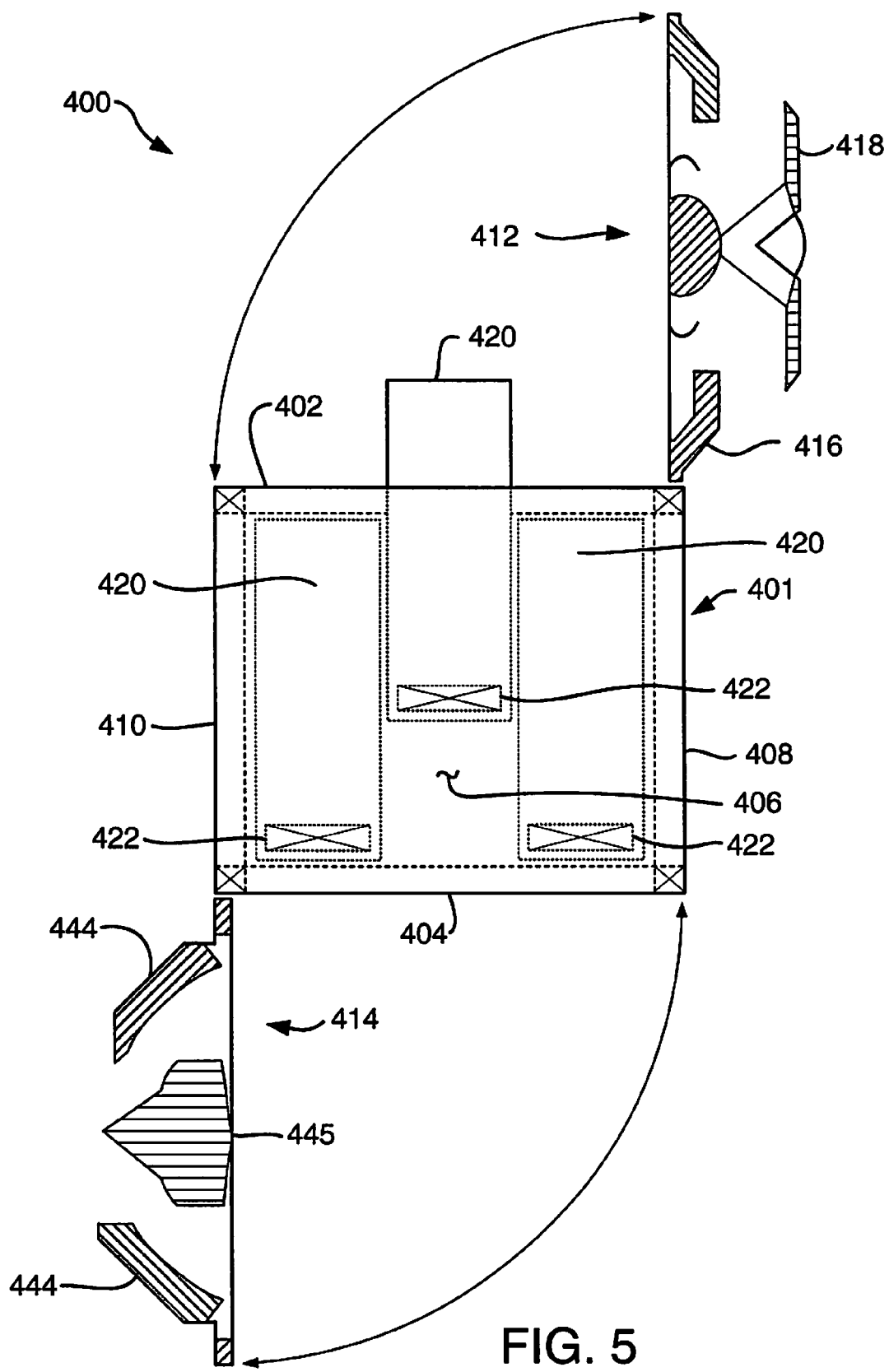
FIG. 5 is a partially sectional, top view of the computer system shown in FIG. 4, with its vented intake and exhaust doors open.
Figure 6:
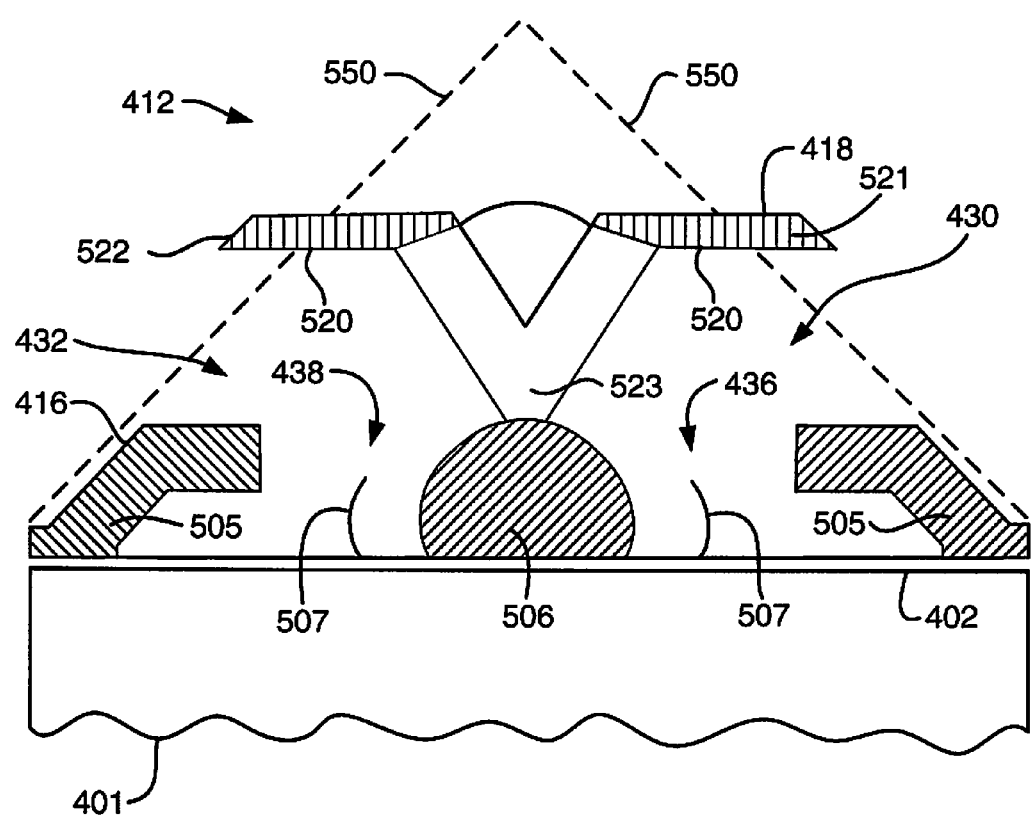
FIG. 6 is an enlarged sectional, partial top view of a portion of the computer system shown in FIG. 4 in the vicinity of the vented intake door.
Figure 7:
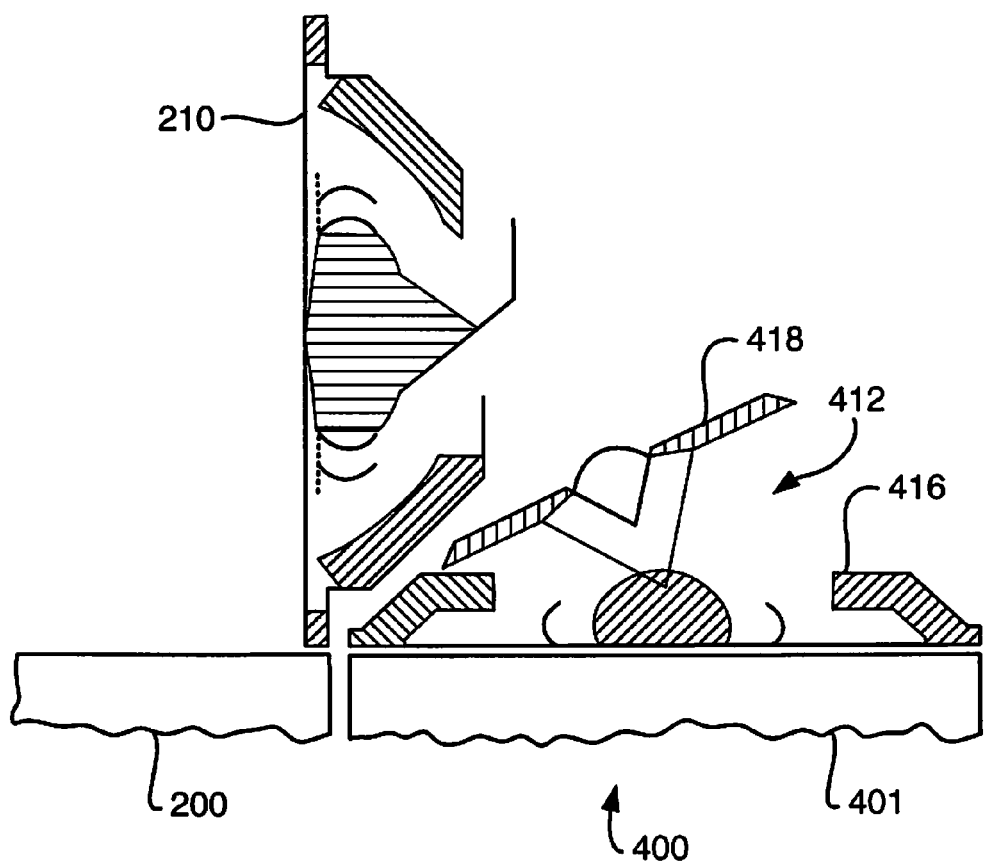
FIG. 7 is a sectional, partial top view of a portion of the computer system shown in FIG. 4 but with its outer door pivoted to a left leaning configuration against an adjacent conventional vented door of a neighboring computer system in an open configuration.
Figure 8:
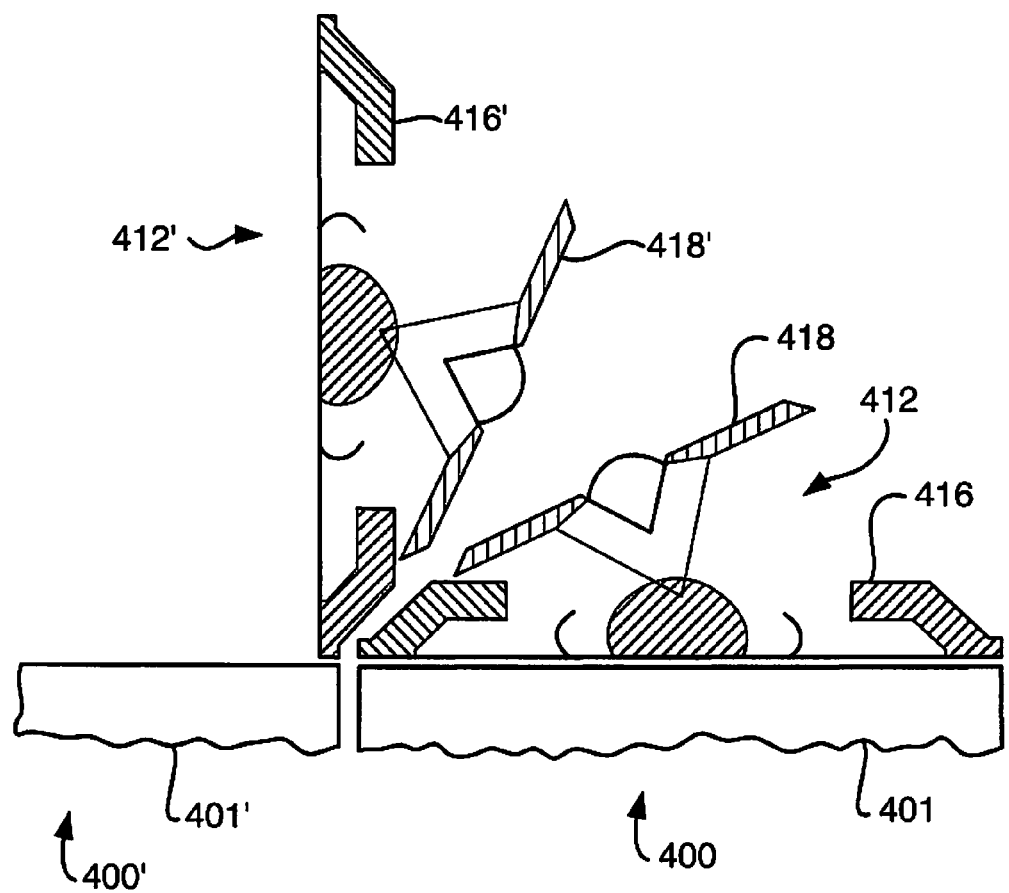
FIG. 8 is a sectional, partial top view of a portion of the computer system shown in FIG. 4 but with its outer door pivoted to a left leaning configuration against an adjacent vented door of a neighboring computer system in an open configuration with its outer door pivoted to a right leaning configuration.

Outer door 418 is pivotably attached to vented base 416. Preferably, as discussed in more detail below, outer door 418 pivots between a left leaning configuration (as shown in FIG. 7, as well as shown in FIG. 8 with respect to the vented door in the closed configuration), a central configuration (as shown in FIGS. 4-6), and a right leaning configuration (as shown in FIG. 8 with the vented door in the open configuration). For example, outer door 418 may be pivotably attached to vented base 416 using a hinge pin (as shown in FIGS. 10-14), and may be biased to return to the central configuration by a self-centering spring (not shown) wound around the hinge pin or a gravity-return hinge mechanism (i.e., similar to that on a refrigerator door).

The configuration of vented doors 412, 414 shown in FIG. 4 is illustrative, and the present invention is not limited thereto. The vented doors 412, 414 may abut against any panels of the computer system enclosure 401 having airflow passages therein. For example, vented doors 412, 414 may be respectively mounted at the side and top of computer system enclosure 401. Also, a single vented door may be used (e.g., an exhaust door, an intake door, or a combination exhaust/intake door), or more than two vented doors may be used. Likewise, the present invention may be applied to an exhaust door rather than, or in addition to, being applied to an intake door.

The vented doors 412, 414 are pivotably attached to computer system enclosure 401 to allow access to computer system components within computer system enclosure 401. Referring now to FIG. 5, vented doors 412, 414 are pivotably attached to computer system enclosure 401 using one or more hinges to permit access to removable drawers 420 when vented doors 412, 414 are swung open (i.e., into the open configuration).

In addition, vented doors 412, 414 are preferably removable from the computer system enclosure 401. In this regard, the two-piece construction of vented door 412 is advantageous because outer door 418 can be removed separately from vented base 416. As discussed above in the Background Art section, the weight of conventional vented doors can be excessive. For example, the weight of a conventional vented door often approaches or exceeds the maximum weight one person is permitted to lift (e.g., 39.7 pounds). This prior art situation is disadvantageous because it requires two customer engineers (CEs) to be sent on service calls. However, the two-piece construction of vented door 412 according to the preferred embodiments of the present invention overcomes this problem because the combined weight of vented base 416 and outer door 418 need not be lifted when removal is necessary. For example, prior to removing vented base 416 from computer system enclosure 401, the hinge pin by which outer door 418 is pivotably attached to vented base 416 may be withdrawn to remove outer door 418 from vented base 416. Then, vented base 416 may be removed from computer system enclosure 401 by removing the fasteners (e.g., bolts, screws, clamps, hangers, etc) that attach the one or more conventional hinges by which vented base 416 is pivotably attached to computer system enclosure 401.

With reference now to both FIGS. 4 and 5, computer system enclosure 401 provides mechanical support for one or more electronic component packages, such as electronics drawers 420. The electronics drawers 420 are used to package processors of computer system 400, along with their associated electronics (e.g., memory, disk drives, power supplies, etc.). Alternatively, the processors of computer system 400 and their associated electronics may be mounted in computer system enclosure 401 without being packaged in electronics drawers. Computer system enclosure 401 further includes at least one air moving device, such as device 422. In computer system enclosures having multiple electronics drawers, one or more moving device 422 may be associated with each electronics drawer 420. Each air moving device 422 may be physically attached to the electronics drawer 420 with which it is associated. Alternatively, air moving devices may be physically attached to computer system enclosure 401. Preferably, electronics drawers 420 are slidably mounted within computer system enclosure 401, providing easy access to the contents of electronics drawers 420 for repair, maintenance, and upgrades. Alternatively, electronics drawers 420 may be permanently mounted within computer system enclosure 401, using fasteners such as bolts, screws or clamps.

Figure 13:
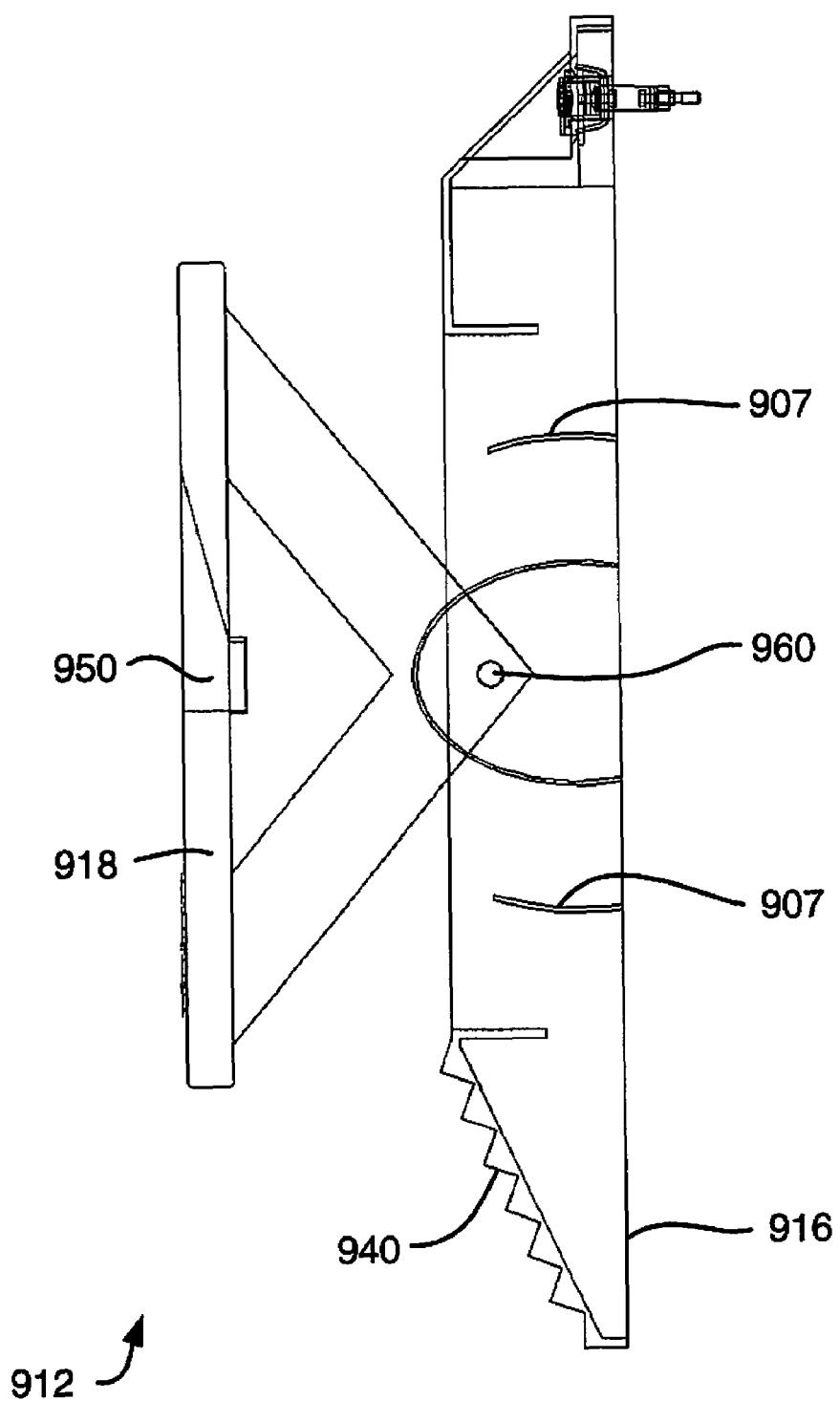
FIG. 13 is a sectional, top view of the vented intake door shown in FIG. 9.

Referring to FIG. 4, air moving devices 422 cause ambient air to enter computer system enclosure 401 through one or more intake apertures 430, 432 in front vented door 412 between outer door 418 and vented base 416 in the directions shown by the intake arrows designated with reference numeral 434. In other words, in the embodiment shown in FIG. 4 front vented door 412 is an intake door. Although not shown in FIG. 4, outer door 418 may optionally have one or more intake apertures extending therethrough (as best seen in FIG. 13). Next, air flows through one or more airflow apertures 436, 438 extending through vented base 416 in the directions shown by the airflow arrows 440. Air then flows in the directions shown by airflow arrows 445 over or through electronics drawers 420, where heat is transferred to the air from heat generating components within electronics drawers 420, thereby increasing the temperature of the air as it passes over or through electronics drawers 420. Heated air then exits computer system enclosure 401 through one or more exhaust apertures 446 in rear vented door 414 in the directions shown by the exhaust arrows designated by reference numeral 450, where it returns to and mixes with room ambient air. In other words, in the embodiment shown in FIG. 4 rear vented door 414 is an exhaust door.

Figure 3:
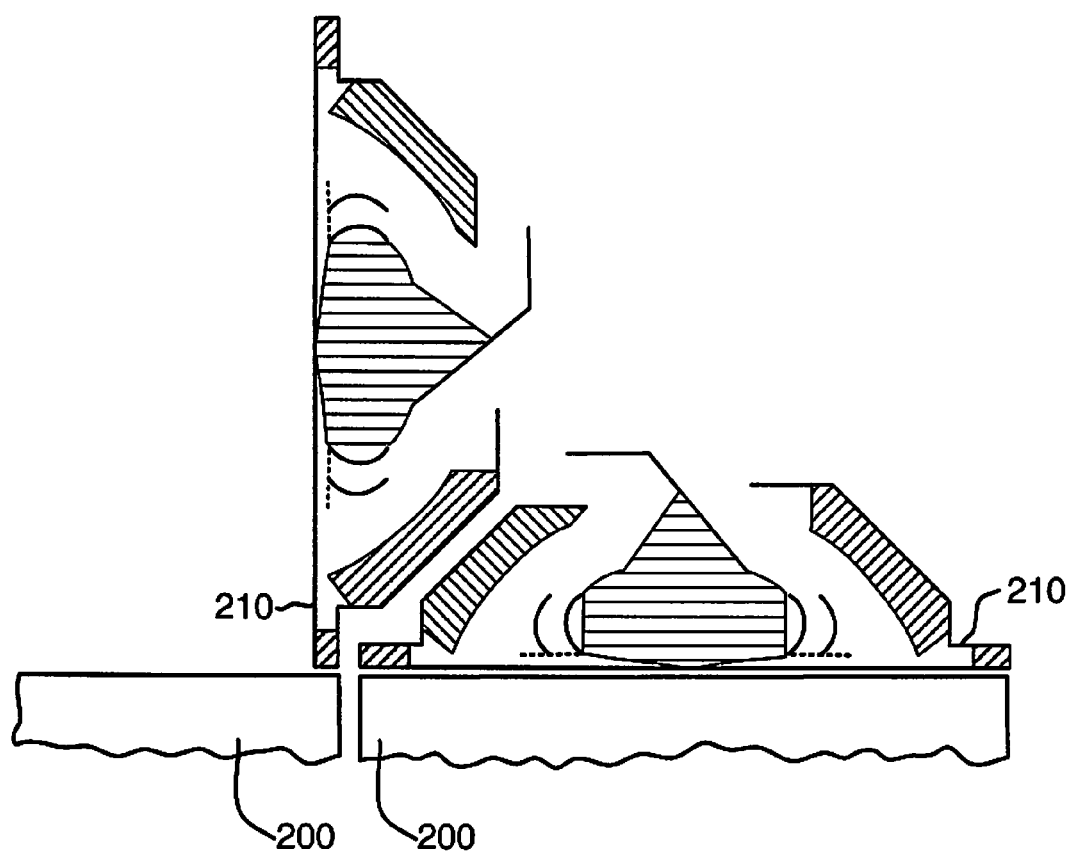
FIG. 3 is a sectional, partial top view of a portion of the computer system shown in FIG. 2 but with one of its vented covers pivoted to an open configuration against an adjacent vented cover of a neighboring computer system in a closed configuration, as known in the art.

As mentioned above, vented exhaust door 414 is conventional and generally corresponds to exhaust cover 320 discussed above in the Background Art section with reference to FIG. 3. Accordingly, vented exhaust door 414 is only briefly discussed herein. Vented exhaust door 414 includes an acoustic noise reduction lining comprising two outer acoustic foam panels 444 and central acoustic foam block 445. Exhaust apertures 446 are defined between outer acoustic foam panels 444 and central acoustic foam block 445.

Additional aspects of the construction of vented intake door 412 are now described with reference to FIG. 6. FIG. 6 is an enlarged sectional, partial top view of a portion of the computer system shown in FIG. 4 in the vicinity of vented intake door 412. As mentioned earlier, vented intake door 412 includes a vented base 416 and an outer door 418. Both vented base 416 and outer door 418 include acoustic noise reduction lining, such as an acoustic foam lining. Examples of acoustic noise reduction lining include open and closed cell, flexible polyurethane, polyimide, melamine and other foams available from Soundcoat Company of Deer Park, N.Y. (These examples are representative of a class of products serving similar functions and do not imply any particular requirement for the specific characteristics of these products).

Vented base 416 includes an acoustic noise reduction lining comprising two outer acoustic foam panels 505 and central acoustic foam block 506. Airflow apertures 436, 438 are defined between outer acoustic foam panels 505 and central acoustic foam block 506. Preferably, both airflow apertures 436, 438 are lined with an acoustic noise reduction lining in their entirety. Vented base 416 also includes two or more curved vanes 507 that are configured and positioned to suitably direct and distribute the incoming air through airflow apertures 436, 438 and toward the various heat generating components housed within computer system enclosure 401. As discussed above, vented base 416 is pivotably attached to computer system enclosure 401 and pivots through an angle of approximately 90° from the closed configuration to the open configuration using one or more conventional hinges (not shown) attached to both vented base 416 and computer system enclosure 401.

Outer door 418 includes an acoustic noise reduction lining comprising two acoustic foam panels 520. Intake apertures 430, 432 are defined between acoustic foam panels 520 of outer door 418 and acoustic foam panels 505 of vented base 416. Outer door 418 is generally T-shaped having two wing shaped portions 521, 522 extending from a base portion 523 respectively over airflow apertures 436, 438. The base portion 523 of outer door 418 is pivotably attached to vented base 416 using, for example, a hinge pin (as shown in FIGS. 10-14) and may be biased to return the central configuration by a self-centering spring (not shown) wound around the hinge pin. Outer door 418 pivots between a left leaning configuration wherein wing-shaped portion 522 moves closer to vented base 416, a central configuration (as shown in FIG. 6), and a right leaning configuration wherein wing-shaped portion 521 moves closer to vented base 416.

Figure 1:
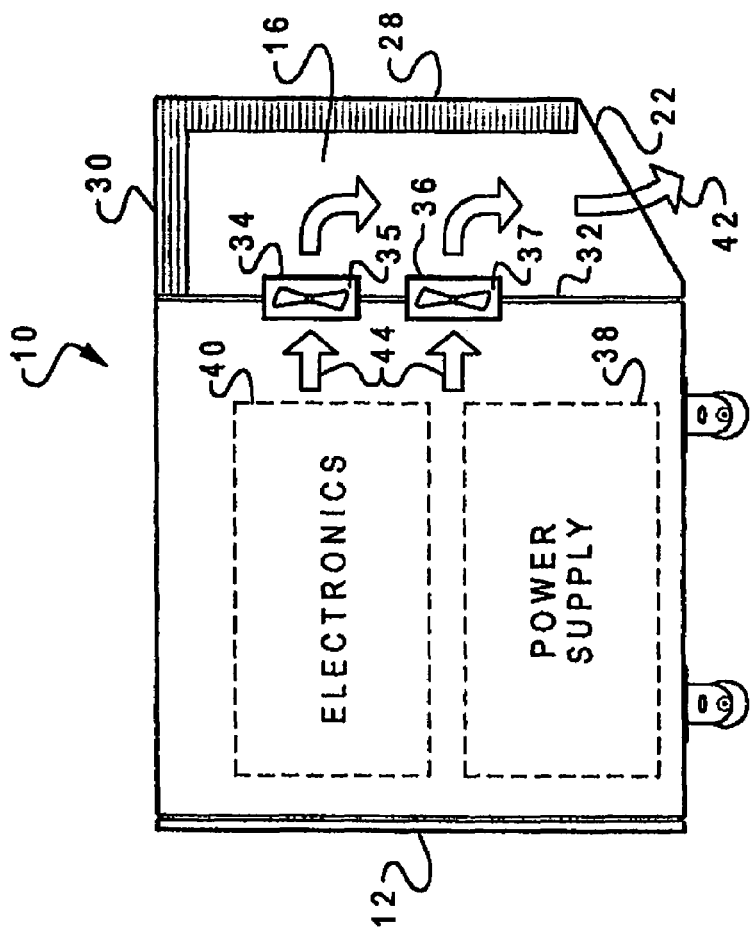
FIG. 1 is a sectional, partly schematic side view of a computer system incorporating an acoustic dampening cooling fan shroud panel, as known in the art.
Figure 2:
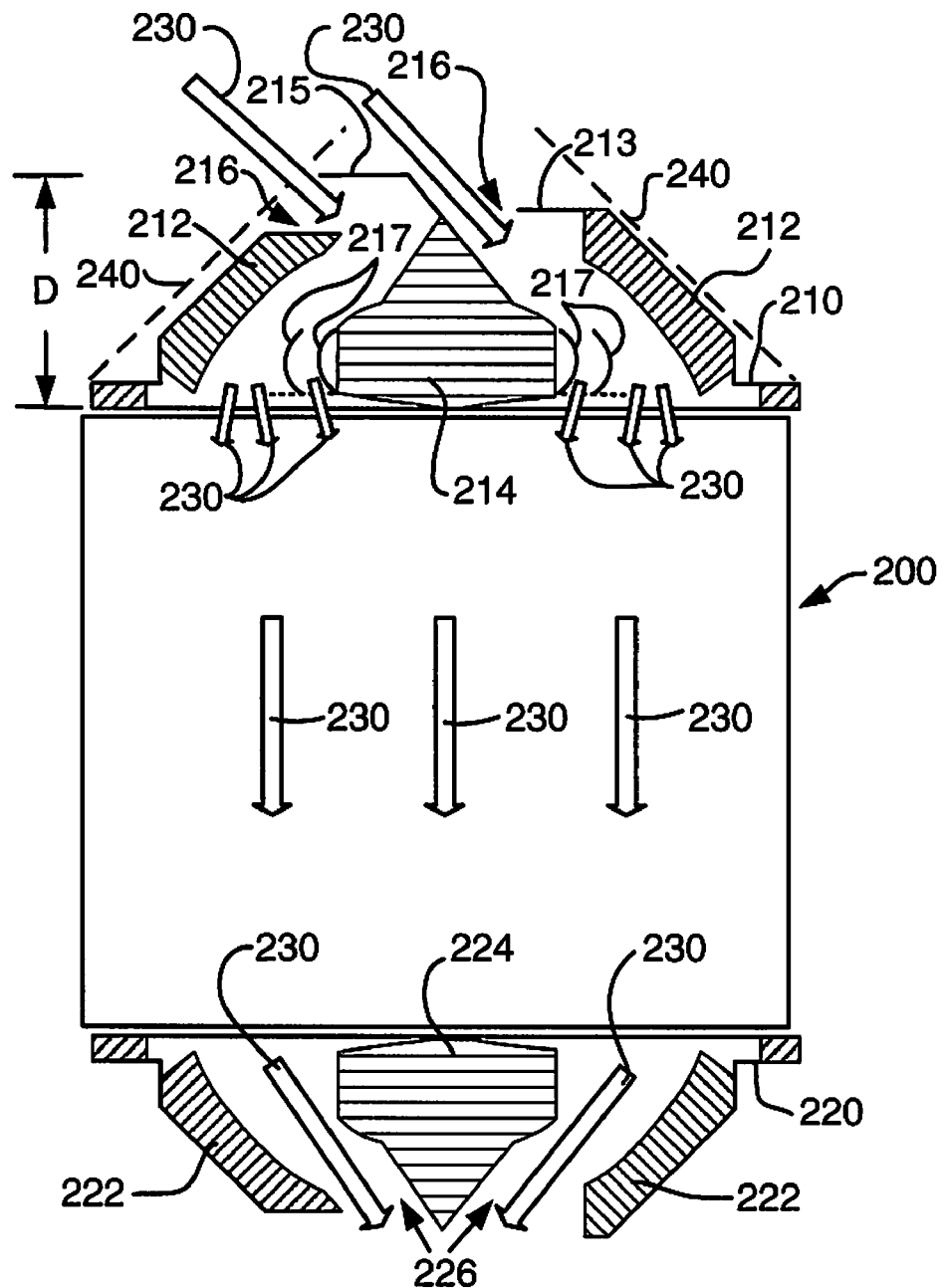
FIG. 2 is a sectional, top view of a computer system incorporating vented covers each with an acoustic noise reduction lining that includes two outer acoustic foam panels and a central acoustic foam block, as known in the art.

Because outer door 418 can pivot into the left and right leaning configurations, outer door 418 unlike conventional vented doors is not dimensionally confined to an area within the traditional physical envelope (denoted in FIG. 6 as two dashed lines labeled as 550) necessary to allow adjacent vented doors to hinge open against each other. For example, with reference to FIG. 2, the dimensions of conventional inlet cover 210 and conventional exhaust cover 220 are each limited to an area within a physical envelope (denoted in FIG. 2 as two dashed lines labeled as 240 with respect to inlet cover 210) that does not interfere with swinging one cover open 90° against an adjacent cover. In accordance with the preferred embodiments of the present invention, interference with a neighboring computer system's vented door is avoided due to the pivoting motion of outer door 418. Hence, the two wing-shaped portions 521, 522 of the outer door 418 can extend outside the traditional physical envelope 550 without interfering with a neighboring computer system's vented door. As discussed in more detail below, by increasing the width of outer door 418 (i.e., the wing-shaped portions 521, 522 of outer door 418 extend beyond traditional physical envelope 550) the attenuation efficiency of vented door 412 is improved relative to conventional vented doors. This advantageously permits the depth of vented door 412 to be decreased relative to conventional vented doors with the same level of acoustic attenuation.

The acoustic noise reduction lining may be, for example, self-adhesive panels that are cut to define intake apertures 430, 432 and airflow apertures 436, 438 as well as conform to the surface of an outer shell. Alternatively, the acoustic noise reduction lining may be provided by any other technique known in the art (e.g., cutting, molding, spraying, etc.). Preferably, in large sizes, vented base 416 and outer door 418 each includes a metal outer shell (best seen in FIG. 13) into which are inserted acoustic foam panels 505, central acoustic foam block 506, and acoustic foam panels 520. The outer metal shell could provide electromagnetic interference protection. For smaller applications such as PC tower sizes, the outer shell could be plastic or other nonmetal material. Advantageously, a plastic outer shell reduces the weight of vented base 416 relative to using a metal outer shell.

It is generally desirable for air/noise to stay in intake apertures 430, 432 and airflow apertures 436, 438 for as long as possible to increase attenuation efficiency. The increased width of outer door 418 (e.g., the wing-shaped portions of outer door 418 extend outside the physical envelope) provides a relatively longer air path. This long air path allows the surface area of the sound absorbing material (i.e., the acoustic noise reduction lining) to be increased relative to conventional vented doors, thereby improving acoustic attenuation. Accordingly, at a given level of acoustic attenuation, vented door 412 may be constructed to have a depth (denoted as dimension "D" in FIG. 4) that is less than that of conventional vented doors. The long air path also reduces the "line of sight" to noise sources, which further improves acoustic attenuation. In this case, "line of sight" means that if you can easily see through the apertures to the other side of door, then noise has a similar, easy way out of the cover. Reducing "line of sight" reduces the level of noise that can pass through.

FIG. 7 is a sectional, partial top view of a portion of computer system 400 with its outer door 418 pivoted to a left leaning configuration against an adjacent conventional vented door 210 of a neighboring computer frame 200 in an open configuration. Hence, interference between vented door 412 and adjacent conventional vented door 210 is avoided even though outer door 418 is oversized with respect to the traditional physical envelope.

FIG. 8 is a sectional, partial top view of a portion of computer system 400 with its outer door 418 pivoted to a left leaning configuration against an adjacent vented door 412' of a neighboring computer system 400' in an open configuration with its outer door 418' pivoted to a right leaning configuration. Hence, interference between vented door 412 and vented door 412' is avoided even though outer doors 418, 418' are oversized with respect to the traditional physical envelope.

Figure 9:
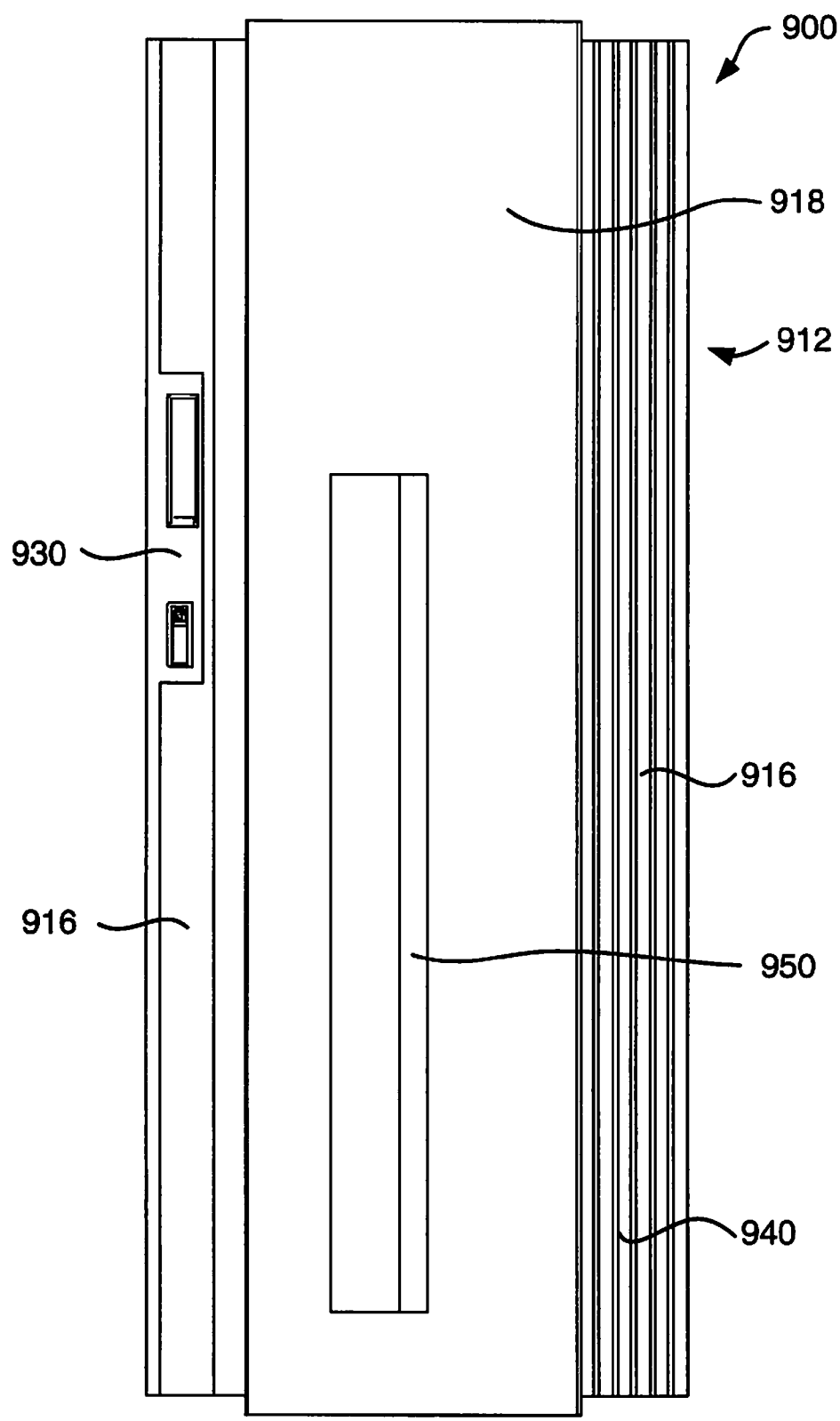
FIG. 9 is an elevational, front view of a computer system incorporating a vented intake door having a vented base and a outer door according to the preferred embodiments of the present invention.

FIG. 9 is an elevational, front view of a computer system 900 incorporating a vented intake door 912 having a vented base 916 and a outer door 918 according to the preferred embodiments of the present invention. In the embodiment shown in FIG. 9, vented base 916 is asymmetric and includes a latch and control panel area 930 on the left side and chamfer saw-tooth ridges 940 on the right side. Also, outer door 918 includes an intake aperture 950.

Figure 10:
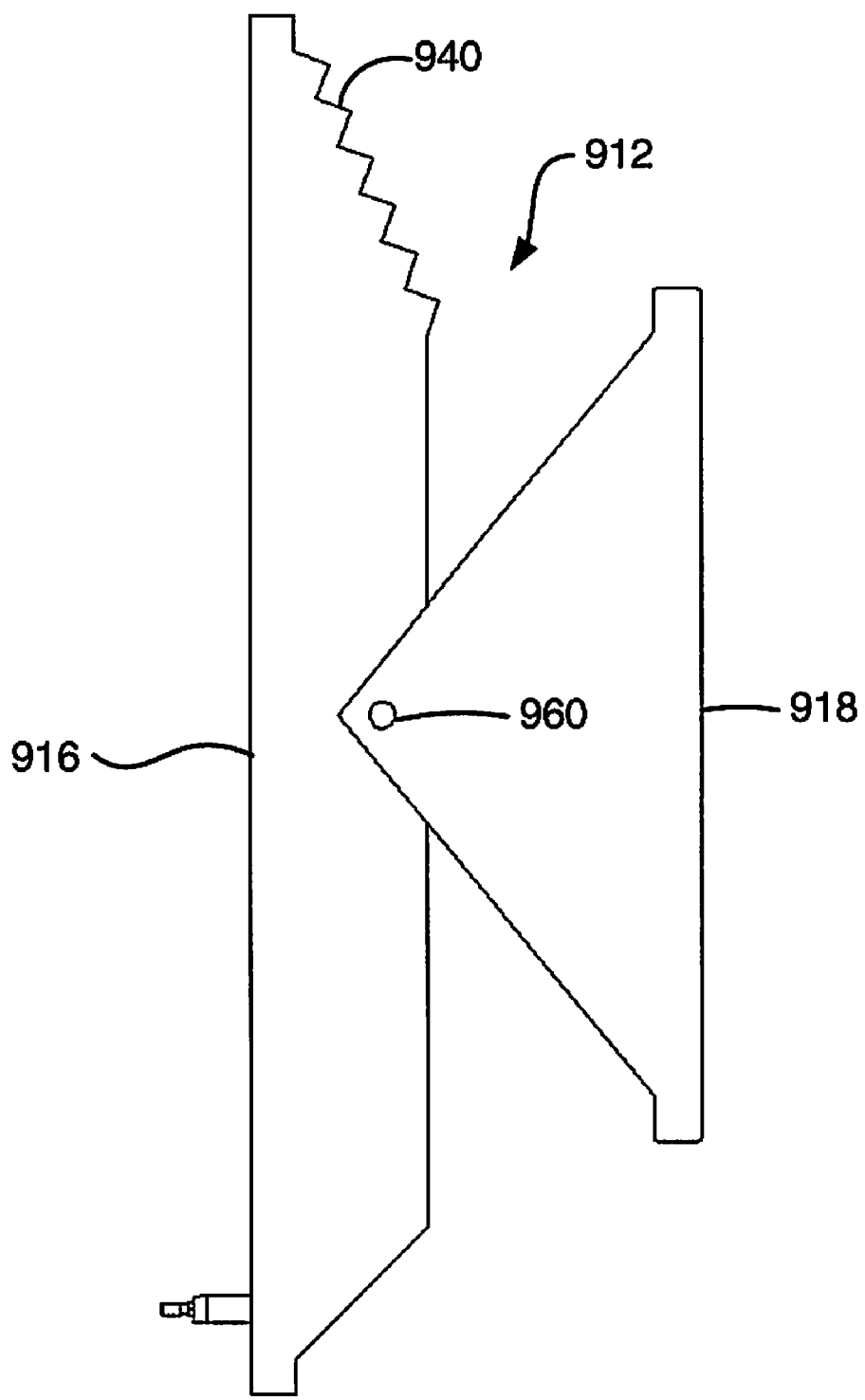
FIG. 10 is a top view of the vented intake door shown in FIG. 9.

FIG. 10 is a top view of vented intake door 912. In the embodiment shown in FIGS. 10-14, outer door 918 is pivotably attached to vented base 916 using a hinge pin 960.

Figure 11:
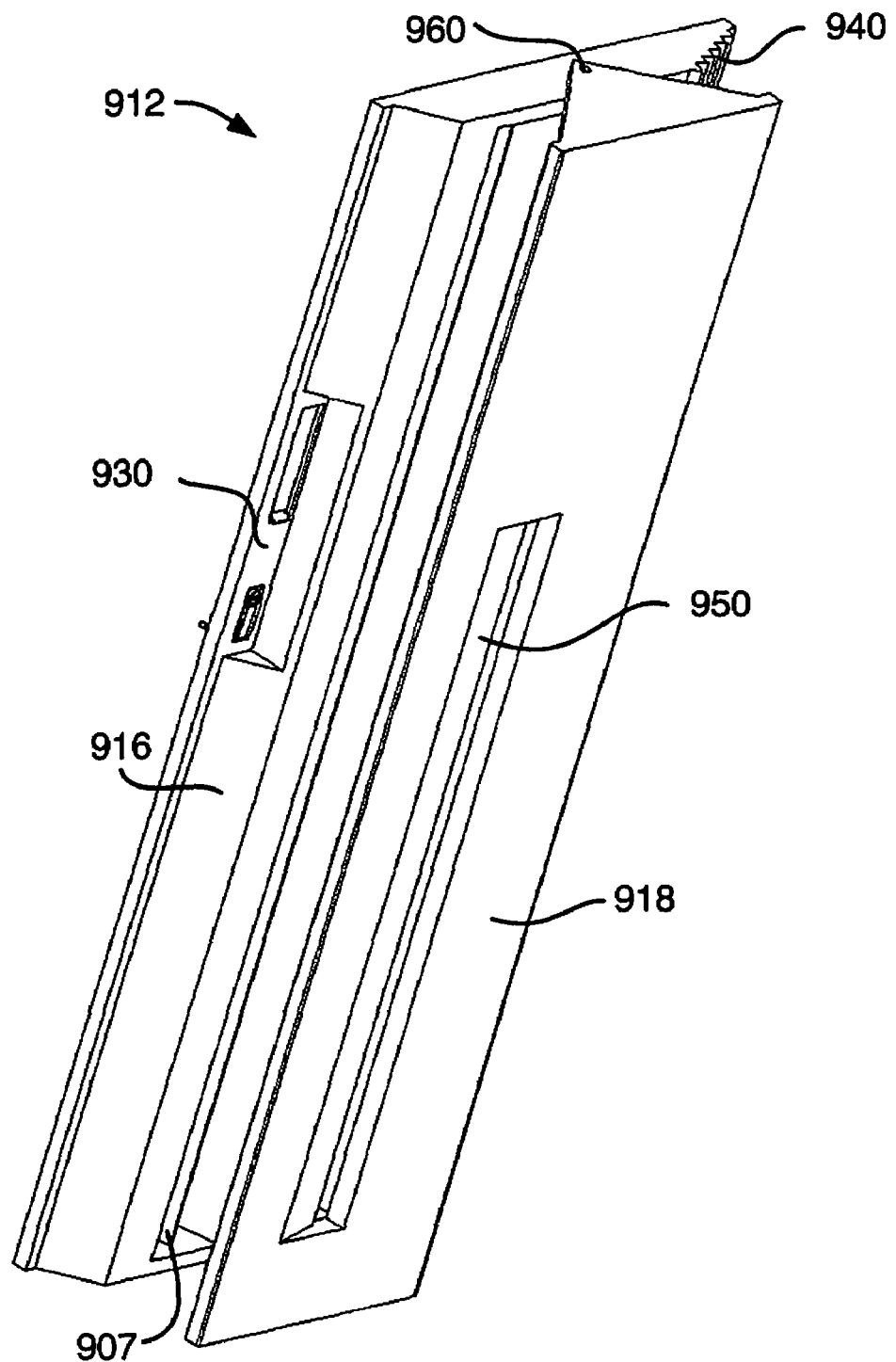
FIG. 11 is a front, left side, perspective view of the vented intake door shown in FIG. 9.
Figure 12:
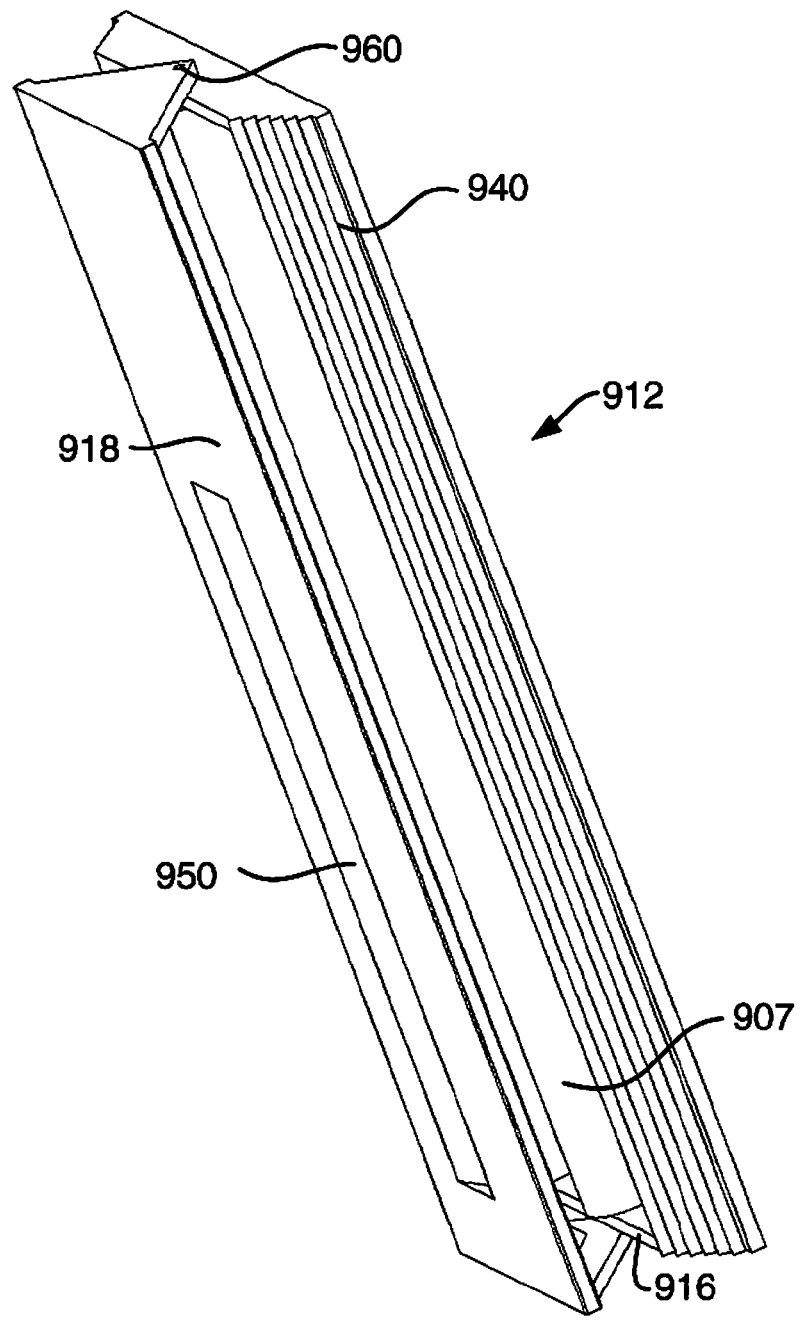
FIG. 12 is a front, right side, perspective view of the vented intake door shown in FIG. 9.
Figure 14:
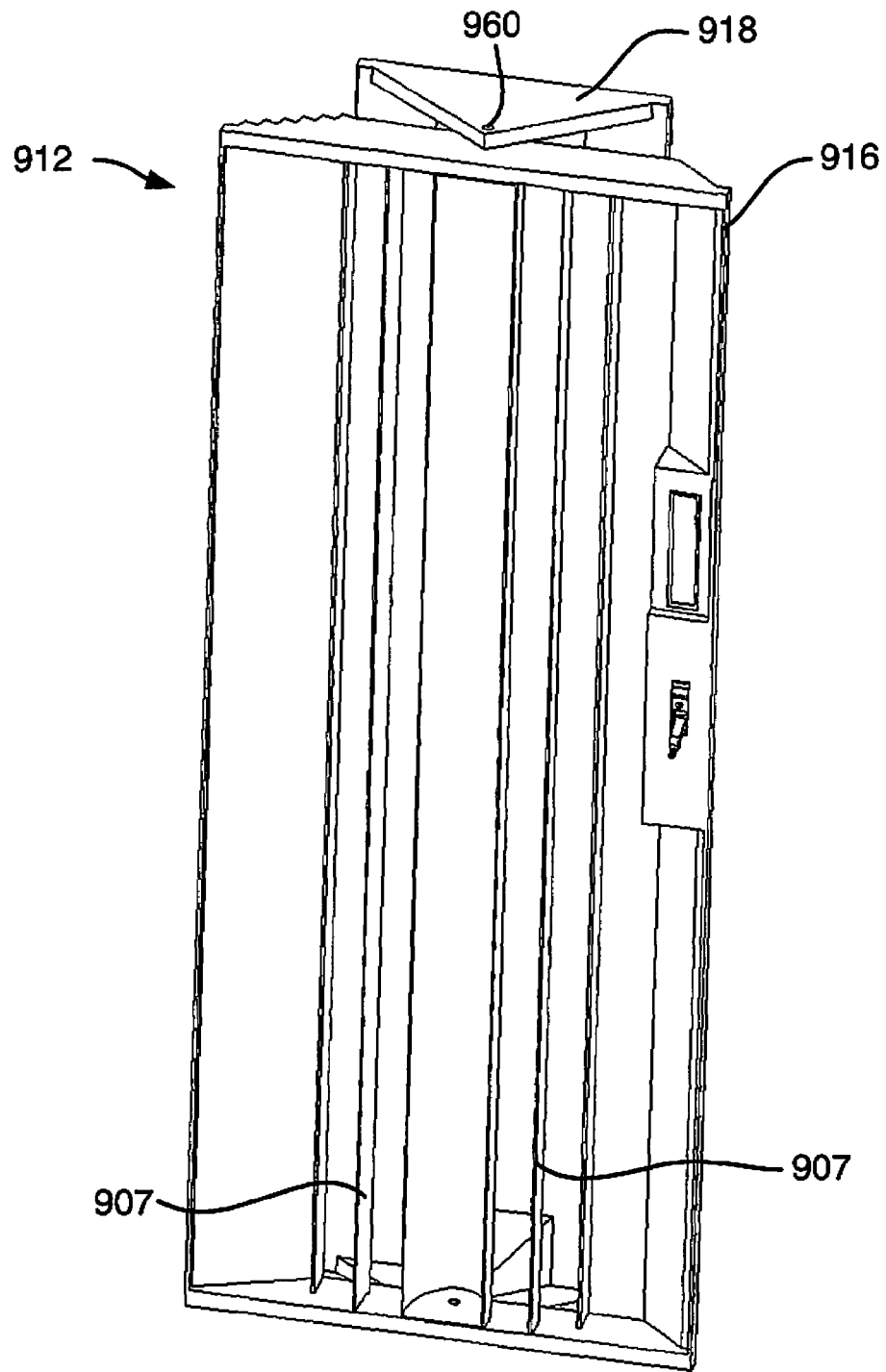
FIG. 14 is a rear, perspective view of the vented intake door shown in FIG. 9.

FIG. 11 is a front, left side, perspective view of vented intake door 912. FIG. 12 is a front, right side, perspective view of vented intake door 912. FIG. 13 is a sectional, top view of vented intake door 912. FIG. 14 is a rear, perspective view of vented intake door 912. As best seen in FIGS. 13 and 14, vented base 916 also includes two or more curved vanes 907 that are configured and positioned to suitably direct and distribute the incoming air through the airflow apertures and toward the various heat generating components housed within the computer system enclosure. Also in FIGS. 13 and 14, the acoustic noise reduction lining is removed to more clearly show the outer shell in which the acoustic noise reduction lining is provided.

One skilled in the art will appreciate that many variations are possible within the scope of the present invention. Although the preferred embodiments of the present invention is described herein within the context of an enclosure for containing a computer system, those skilled in the art will appreciate that the present invention may be practiced with an enclosure for containing any type of system. For example, the present invention may be practiced with an enclosure for an air treatment system, such as an air filter, air cleaner, dehumidifier, air conditioner, heater, or the like in lieu of an enclosure containing a computer system. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A computer system, comprising:
    an electronic component package;
    an enclosure for containing the electronic component package, the enclosure including a front panel, a rear panel, a top panel, a bottom panel, and two side panels;
    an air moving device for passing air through the enclosure;
    a vented base pivotably attached to the enclosure, the vented base being pivotable between a closed configuration where the vented base abuts against a selected one of the panels and an open configuration where the vented base is pivoted away from the selected one of the panels, the vented base having one or more airflow apertures at least of portion of which includes an acoustic noise reduction lining;
    an outer door pivotably attached to the vented base and wherein at least a portion of the outer door includes an acoustic noise reduction lining, wherein the outer door is generally T-shaped having two wine-shaped portions extending from a base portion, and wherein the base portion of the outer door is pivotally attached to the vented base by at least one hinge pin.

2. The computer system as recited in claim 1, wherein the vented base includes two airflow apertures separated by a central acoustic foam block, and wherein one of the two wing-shaped portions of the outer door projects over one of the two airflow apertures and the other of the two wing-shaped portions of the outer door projects over the other of the two airflow apertures.

3. The computer system as recited in claim 1, wherein when the vented base is in the closed configuration and as an adjacent vented door of a neighboring computer system is pivoted into an open configuration toward the vented base and the outer door, the outer door pivots relative to the vented base so that one of the wing-shaped portions of the outer door moves closer to the vented base and thereby avoids interfering with the adjacent vented door.

4. The computer system as recited in claim 1, wherein when the vented base is pivoted into the open configuration toward an adjacent vented door of a neighboring computer system, the outer door pivots relative to the vented base so that one of the wing-shaped portions of the outer door moves closer to the vented base and thereby avoids interfering with the adjacent vented door as the vented base is pivoted into the open configuration toward the adjacent vented door.

5. A vented door for a system having an enclosure, the vented door comprising:
    a vented base including one or more hinges for pivotable attachment to the system's enclosure, the vented base being pivotable between a closed configuration where the vented base abuts against a panel of the system's enclosure and an open configuration where the vented base is pivoted away from the panel of the system's enclosure, the vented base having one or more airflow apertures at least of portion of which includes an acoustic noise reduction lining;
    an outer door pivotably attached to the vented base and wherein at least a portion of the outer door includes an acoustic noise reduction lining, wherein the outer door is generally T-shaped having two wing-shaped portions extending from a base portion, and wherein the base portion of the outer door is pivotally attached to the vented base by at least one hinge pin.

6. The vented as recited in claim 5, wherein the vented base includes two airflow apertures separated by a central acoustic foam block, and wherein one of the two wing-shaped portions of the outer door projects over one of the two airflow apertures and the other of the two wing-shaped portions of the outer door projects over the other of the two airflow apertures.

* * * * *